United States Patent [19]

Porter

[11] Patent Number: 4,866,570
[45] Date of Patent: Sep. 12, 1989

[54] APPARATUS AND METHOD FOR COOLING AN ELECTRONIC DEVICE

[75] Inventor: Warren W. Porter, Escondido, Calif.

[73] Assignee: NCR Corporation, Dayton, Ohio

[21] Appl. No.: 229,051

[22] Filed: Aug. 5, 1988

[51] Int. Cl.[4] .............................................. H05K 7/20
[52] U.S. Cl. .................................... 361/382; 361/385; 357/82; 165/104.21; 165/104.33
[58] Field of Search ...................... 62/55, 64, 304, 314, 62/315, 316, 512, 513, 514 R, 515, 516, 441; 174/15.1, 15.2, 15.4; 361/385, 382; 357/82; 165/80.4, 104.21, 104.33

[56] References Cited

U.S. PATENT DOCUMENTS

| | | | |
|---|---|---|---|
| 3,361,195 | 1/1968 | Meyerhoff et al. | 165/80 |
| 3,524,497 | 8/1970 | Chu et al. | 165/80 |
| 3,725,566 | 4/1973 | Plizak | 174/15.1 |
| 3,909,225 | 9/1975 | Rooney | 62/514 |
| 3,986,550 | 10/1976 | Mitsuoka | 165/105 |
| 4,009,417 | 2/1977 | Waldon | 361/385 |
| 4,036,291 | 7/1977 | Kobayashi | 165/104.33 |
| 4,485,429 | 11/1984 | Mittal | 361/386 |
| 4,561,040 | 12/1985 | Eastman et al. | 361/385 |
| 4,614,227 | 9/1986 | Vogel | 165/80.4 |
| 4,745,760 | 5/1988 | Porter | 62/514 R |

*Primary Examiner*—Gerald P. Tolin
*Attorney, Agent, or Firm*—Wilbert Hawk, Jr.; Stephen F. Jewett; Douglas S. Foote

[57] ABSTRACT

The subject invention is an apparatus and method for cooling an electronic device. The apparatus comprises a vessel having upper and lower regions and inlet means for delivering a flow of cooling fluid to the upper region. The apparatus also includes means for positioning the device within the lower region but above the bottom of the vessel, and divider means within the vessel disposed between the flow and the device.

21 Claims, 3 Drawing Sheets

APPARATUS AND METHOD FOR COOLING AN ELECTRONIC DEVICE

The present invention relates to an apparatus and method for cryogenically cooling an electronic device.

BACKGROUND OF THE INVENTION

It is well known that the performance of some electronic devices can be improved by cooling them to cryogenic temperatures. Typically, such cooling can be achieved by the use of a cryogenic fluid such as liquid or gaseous Nitrogen or Helium. One way of implementing cryogenic cooling is to immerse the electronic device in the fluid. However, an electronic device can be damaged by the thermal shock resulting from too rapidly cooling the device.

OBJECTS OF THE INVENTION

It is therefor an object of the present invention to provide a new and improved apparatus and method for cooling an electronic device.

It is another object of the present to provide an apparatus and method for preventing thermal shock damage to an electronic device by gradual cooling of the device.

It is a further object of the present invention to provide a relatively simple and inexpensive means of controlling the rate of cooling of an electronic device.

SUMMARY OF THE INVENTION

The present invention is an apparatus and method for cooling an electronic device. The apparatus comprises a vessel having upper and lower regions and inlet means for delivering a flow of cooling fluid to the upper region. The apparatus also includes means for positioning the device within the lower region but above the bottom of the vessel, and divider means within the vessel disposed between the flow and the device.

The method comprises the steps of providing a vessel with first, second and third regions, positioning the device within the third region, and sequentially delivering cooling fluid to, and holding the fluid in, the first, second and third regions.

DETAIL DESCRIPTION OF THE INVENTION

Figure 1:
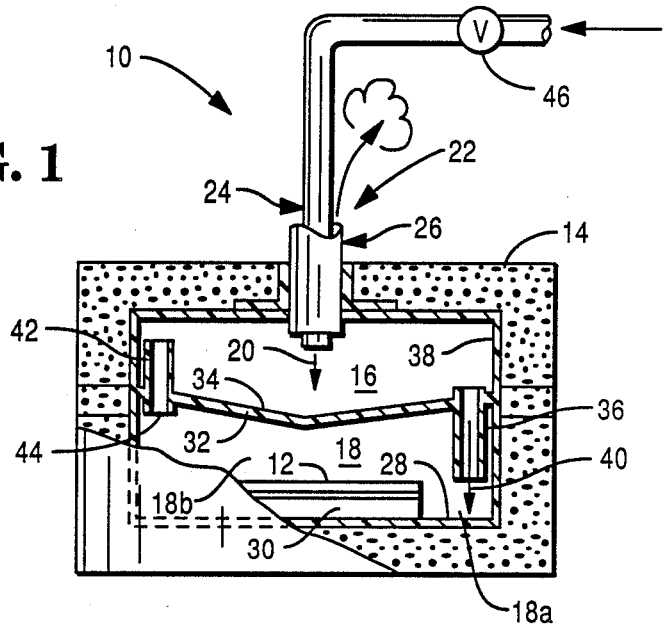
FIG. 1 is a cross sectional side view of an apparatus according to one form of the present invention.

FIG. 1 shows an apparatus 10 for cooling an electronic device, in the form of an integrated circuit 12, according to one embodiment of the present invention. Apparatus 10 includes a vessel 14 having an upper region 16 and a lower region 18. Vessel 14 is preferably insulated for purposes of holding a cryogenic fluid such as liquid Nitrogen or liquid Helium. A flow 20 of this fluid is delivered to upper region 16 of vessel 14 by inlet means 22 which also removes evaporated fluid. Inlet means 22 comprises an inner tube 24 and an outer tube 26. Tubes 24 and 26 are concentrically positioned with inner tube 24 delivering the fluid to upper region 16 and outer tube 26 removing the evaporated fluid therefrom. U.S. Pat. No. 4,745,760, incorporated herein by reference, shows a cryogenic fluid transfer conduit which may be adapted for use as an inlet means for the present invention.

Integrated circuit 12 is positioned within lower region 18 and above the bottom 28 of vessel 14 by means of a socket 30. Integrated circuit 12 is electrically connected to socket 30 which provides electrical connections (not shown) that extend through vessel 14. Lower region 18 is divided into two regions: a first region 18a adjacent to bottom 28 and below integrated circuit 12, and a second region 18b above region 18a. Integrated circuit 12 is located within second region 18b. Divider means 32 is located within vessel 14 and between upper region 16 and lower region 18. As will be discussed more fully hereinafter, divider means 32 is disposed between the cooling fluid flow 20 and integrated circuit 12. Divider means 32 is shaped to capture a portion of the cooling fluid as it enters upper region 16 of vessel 14 through inner tube 24. More specifically, divider means 32 is conically shaped with its concave side 34 facing upper region 16.

Figure 2:
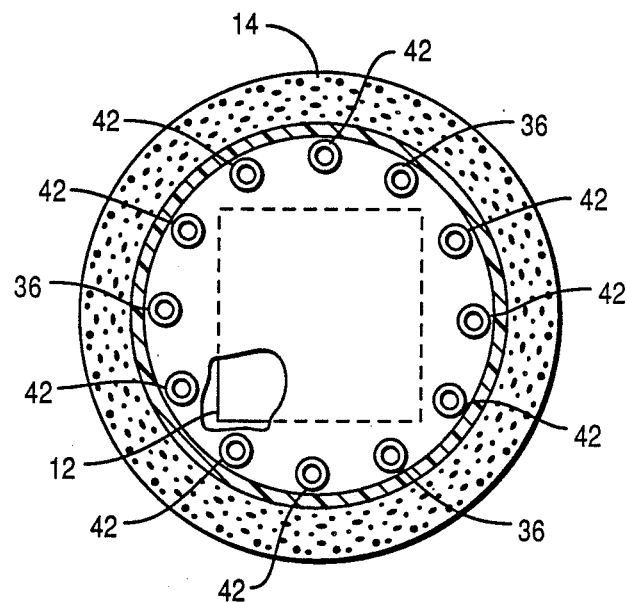
FIG. 2 is a cross sectional top view of the apparatus of FIG. 1.

Apparatus 10 also includes overflow means in the form of a plurality of tubes 36 (see also FIG. 2) which extend through divider means 32 from upper region 16 to lower region 18. As will be discussed more fully hereinafter, tubes 36 transfer cooling fluid from upper region 16 to lower region 18. Tubes 36 are located on the periphery of divider means 32 proximate the inner side wall 38 of vessel 14. The orientation of tubes 36 is such that the flow 40 of cooling fluid passing therethrough is directed away from integrated circuit 12 and into first region 18a.

Relief means in the form of tubes 42 extend through divider means 32 from lower region 18 to upper region 16. The gas of fluid evaporated within lower region 18 may thereby be transferred to upper region 16. The lower end 44 of tube 42 is located near the top of lower region 18 so as to avoid the evaporated fluid from being trapped in lower region 18. As shown, tubes 42 are interspersed with tubes 36 on the periphery of divider means 32. In a preferred embodiment, there are three tubes 42 for every one tube 36 in order to provide sufficient openings for the evacuation of gas from lower region 18.

Figure 3:
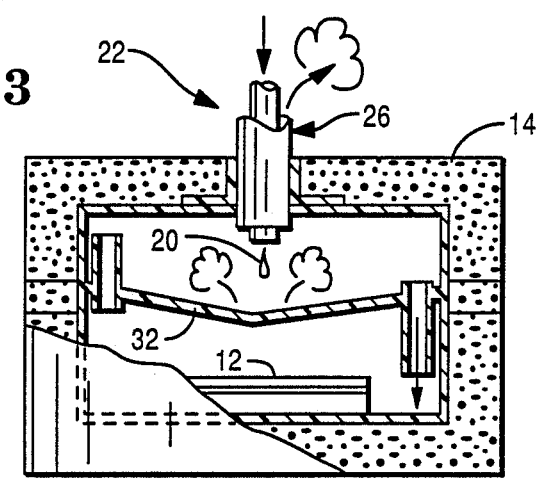
FIGS. 3-5 are schematic views of the apparatus of FIG. 1 illustrating the operation of the present invention.
Figure 4:
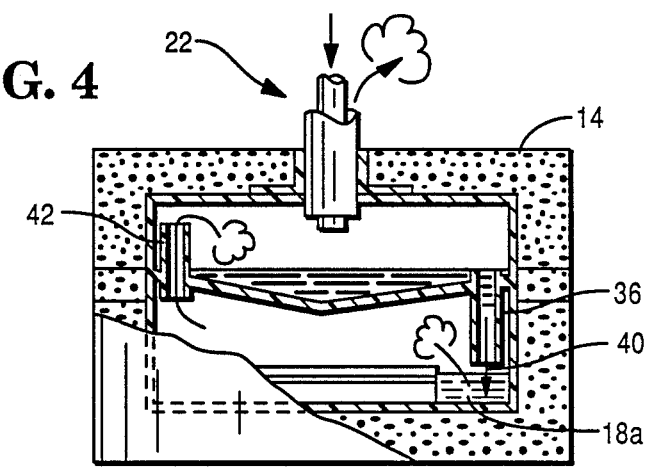
Figure 5:
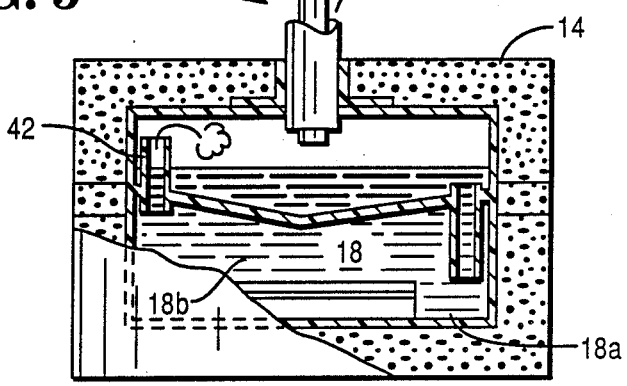

The operation of the invention is shown in the schematic views of FIGS. 3-5. Initially, no cooling fluid is in vessel 14 and integrated circuit 12 is at ambient temperature. Fluid is delivered first to upper region 16 where it is captured by, held by, and cools divider means 32 (FIG. 3). The evaporated fluid is removed by outer tube 26 of inlet means 22. As divider means 32 is cooled the entire interior of vessel 14 including integrated circuit 12 is gradually cooled. At this stage, divider means 32 prevents integrated circuit 12 from direct contact with the cooling flow 20 which might otherwise damage integrated circuit 12 through too rapid cooling.

As the holding capacity of divider means 32 is exceeded, the overflow is delivered to first region 18a of lower region 18 through tubes 36 (FIG. 4). Tubes 36 are oriented so that flow 40 is directed away from and does not strike integrated circuit 12 as it starts to fill up first region 18a. In this manner, the cooling of the interior of vessel 14 including integrated circuit 12 continues but without direct contact of integrated circuit 12 by the cooling fluid. The evaporated fluid escapes through tubes 42 and inlet means 22.

As more cooling fluid enters vessel 14, its level in region 18a rises until it is delivered into region 18b where for the first time it contacts integrated circuit chip 12 directly (FIG. 5). At this point, integrated circuit 12 has been sufficiently cooled so that the thermal shock of direct contact is eliminated or at least reduced to the point where no damage results. Thus, by sequentially delivering cooling fluid to, and holding the fluid in, regions 16, 18a and 18b, integrated circuit 12 is gradually cooled. Tubes 42 still provide an escape for fluid evaporating within lower region 18, and in conjunction with inlet means 22 remove evaporated fluid from vessel 14.

The cooling rate of integrated circuit 12 depends both on the configuration of elements shown and described herein as well as the rate at which cooling fluid enters vessel 14. Accordingly, a valve 46 (see FIG. 1) may be positioned within inner tube 24 to control the rate at which fluid is delivered to vessel 14.

Figure 6:
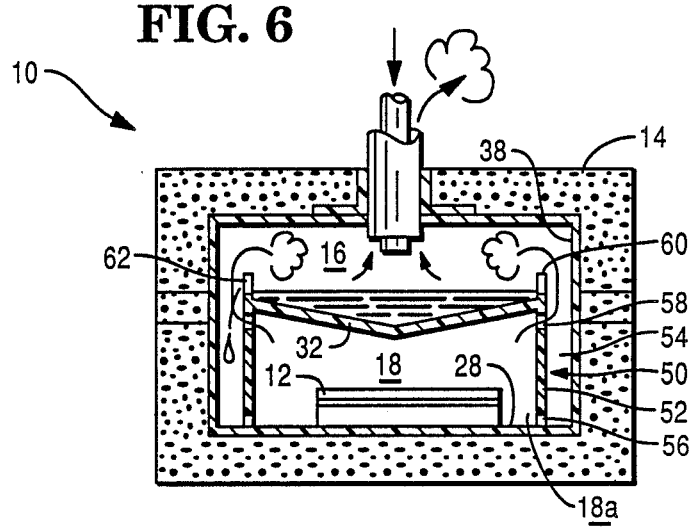
FIG. 6 is a cross sectional side view of an apparatus according to an alternative form of the present invention.

FIG. 6 shows an alternative embodiment of the present invention with like numbers representing similar parts to those shown in FIG. 1. A principle difference between the FIG. 6 and FIG. 1 embodiments resides in the support means 50 for positioning divider means 32 between upper region 16 and lower region 18. Support means 50 includes a wall 52 which surrounds integrated circuit 12 and extends from vessel bottom 28 into upper region 16 where it forms a parapet 60. Wall 52 is attached to the periphery of divider means 32. Wall 52 is spaced inwardly from inner side wall 38 of vessel 14 thereby forming a channel 54 therebetween. A plurality of spaced apart lower openings 56 proximate bottom 28 extend through wall 52. Similarly, a plurality of spaced apart upper openings 58 proximate but below divider means 32 extend through wall 52. Parapet 60 includes a plurality of semicircular scooped out regions 62 which provide flowpaths for the overflow of fluid from region 16 into channel 54. In a preferred embodiment, notches 62 are offset from upper openings 58 to prevent premature contact between the cooling fluid and integrated circuit 12.

The operation of the FIG. 6 embodiment is similar to that described with respect to FIGS. 3-5. Fluid is initially delivered to upper region 16 where it is captured by and cools divider means 32. As the capacity of divider means 32 is exceed, the overflow spills through scooped out regions 62 into channel 54. Wall 52 prevents the overflow from splashing integrated circuit 12 while lower openings 56 allow the cooling fluid to fill up the first region 18a of lower region 18. Fluid continues to be added to vessel 14 until its contents are immersed. Upper openings 58 allow evaporated fluid to escape the confines of support means 50 and divider means 32 into upper region 16.

It will be clear to those skilled in the art that the present invention is not limited to the specific embodiments disclosed and illustrated herein. It will be understood that the dimensions and proportional and structural relationships shown in the drawings are illustrated by way of example only and these illustrations are not to be taken as the actual dimensions or proportional structural relationships used in the apparatus for cooling an electronic device of the present invention.

Numerous modifications, variations, and full and partial equivalents can be undertaken without departing from the invention as limited only be the spirit and scope of the appended claims.

What is desired to be secured by Letters Patent of the United States is as follows:

1. An apparatus for cooling an electronic device comprising:
    a vessel having upper and lower regions;
    inlet means for delivering a flow of cooling fluid to said upper region;
    means for positioning said device within said lower region and above the bottom of said vessel;
    divider means within said vessel disposed between said flow and said device; and
    overflow means transferring fluid from said upper to said lower region such that the overflow means prevents fluid from directly contacting the electronic device.

2. The apparatus of claim 1 wherein said divider means is located between said upper and lower regions.

3. The apparatus of claim 2 wherein said divider means is shaped to capture a portion of said fluid.

4. The apparatus of claim 3 wherein said divider means is conically shaped.

5. The apparatus of claim 1 wherein said overflow means includes a plurality of first tubes extending through said divider means from said upper to said lower region.

6. The apparatus of claim 5 wherein said first tubes are located generally on the periphery of said divider means.

7. The apparatus of claim 1 further comprising:
    relief means for the transfer of evaporated fluid from said lower to said upper region;
    wherein said inlet means includes means for removing said evaporated fluid from said upper region.

8. The apparatus of claim 7 wherein said relief means includes a plurality of second tubes extending through said divider means from said lower to said upper region.

9. The apparatus of claim 7 wherein said inlet means comprises two concentrically positioned inner and outer tubes with the inner tube delivering said fluid and the outer tube removing said evaporated fluid.

10. The apparatus of claim 1 further comprising:
    a valve for controlling the rate at which said inlet means delivers said flow of cooling fluid to said upper region.

11. The apparatus of claim 9 further comprising:
    a valve for controlling the rate at which said inlet means delivers said flow of cooling fluid to said upper region, wherein said valve is positioned within said inner tube.

12. An apparatus for cooling an electronic device comprising:
    a vessel having upper and lower regions;
    inlet means for delivering a flow of cooling fluid to said upper region and for removing evaporated fluid therefrom;
    means for positioning said device within said lower region and above the bottom of said vessel;
    divider means within said vessel located between said first and second regions and disposed between said flow means and said device;
    overflow means for transferring fluid from said upper to said lower region, wherein said overflow means includes a plurality of first tubes extending through said divider means from said upper to said lower region and oriented so that the flow of fluid passing therethrough is directed away from said device; and relief means for the transfer of evaporated fluid from said lower to said upper region.

13. The apparatus of claim 12 wherein said divider means is conically shaped to capture a portion of said fluid.

14. The apparatus of claim 13 wherein said first tubes are located generally on the periphery of said divider means, and wherein said relief means includes a plurality of second tubes extending through said divider means from said lower to said upper region.

15. The apparatus of claim 14 wherein said inlet means comprises two concentrically positioned inner and outer tubes with the inner tube delivering said fluid and the outer tube removing said evaporated fluid.

16. The apparatus of claim 15 further comprising:
a valve for controlling the rate at which said inlet means delivers said flow of cooling fluid to said upper region.

17. The apparatus of claim 1 further comprising:
support means positioning said divider means between said upper and lower regions.

18. The apparatus of claim 17 wherein said divider means is shaped to capture a portion of said fluid and wherein said support means includes a wall surrounding said electronic device and extending from said bottom of said vessel into said upper region and being attached to the periphery of said divider means, wherein said wall is spaced inwardly from the side wall of said vessel thereby forming a channel therebetween.

19. The apparatus of claim 18 wherein said wall includes a plurality of spaced apart lower openings proximate said bottom of said vessel and a plurality of spaced apart upper openings proximate but below said divider means.

20. A method for gradually cooling an electronic device comprising:
providing a vessel with first, second and third regions;
providing inlet means for delivering cooling fluid to said first region;
positioning said device within said third region above the bottom of the vessel;
providing divider means within said vessel between said inlet means and said device; and
sequentially delivering cooling fluid to, and holding said fluid in, said first, second and third regions.

21. The method of claim 20 further comprising the step of:
removing evaporated fluid from said vessel.

* * * * *

UNITED STATES PATENT AND TRADEMARK OFFICE
CERTIFICATE OF CORRECTION

PATENT NO. : 4,866,570
DATED : September 12, 1989
INVENTOR(S) : Warren W. Porter It is certified that error appears in the above-identified patent and that said Letters Patent is hereby corrected as shown below:

Column 4, line 13, add the word --inlet-- after the word said and before the word flow.

Column 4, line 13, add the word --means-- after the word flow.

Column 4, line 63, add the word --inlet-- before the word flow.

Signed and Sealed this

Fifth Day of May, 1992

Attest:

DOUGLAS B. COMER

*Attesting Officer*

*Acting Commissioner of Patents and Trademarks*